(12) United States Patent
Rengarajan et al.

(10) Patent No.: US 7,684,274 B2
(45) Date of Patent: Mar. 23, 2010

(54) HIGH PERFORMANCE, AREA EFFICIENT DIRECT BITLINE SENSING CIRCUIT

(75) Inventors: Santhana Rengarajan, Bangalore (IN); Suresh Balasubramanian, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 59 days.

(21) Appl. No.: 11/953,075

(22) Filed: Dec. 10, 2007

(65) Prior Publication Data

US 2009/0147605 A1 Jun. 11, 2009

(51) Int. Cl.
*G11C 7/02* (2006.01)

(52) U.S. Cl. .................. 365/207; 365/205; 365/154; 365/189.15; 365/189.05

(58) Field of Classification Search .................. 365/207, 365/205, 154, 203, 189.15, 189.05
See application file for complete search history.

(56) References Cited

U.S. PATENT DOCUMENTS 5,650,971 A * 7/1997 Longway et al. ............ 365/207
7,525,854 B2 * 4/2009 Huang ................... 365/189.15

* cited by examiner

*Primary Examiner*—David Lam
(74) *Attorney, Agent, or Firm*—Dawn V. Stephens; Wade James Brady, III; Frederick J. Telecky, Jr.

(57) ABSTRACT

In a method and apparatus for reading a logic state stored in an 8 transistor memory cell (8TMC), a differential sense circuit includes a differential input circuit having a pair of differential inputs and an output. An output signal is provided at the output and is indicative of a difference between two signals received at the pair of differential inputs. The difference is in accordance with the logic state read from the 8TMC. A sense amplifier is coupled to the output, the sense amplifier being operable to amplify the output signal that is greater than a threshold and switch the output signal to a voltage level corresponding to the logic state. The difference between the two signals measurable over a configurable time period is greater than a corresponding change in any one of the two signals measured over the same period, thereby improving the performance of the 8TMC.

19 Claims, 10 Drawing Sheets

HIGH PERFORMANCE, AREA EFFICIENT DIRECT BITLINE SENSING CIRCUIT

BACKGROUND

The present invention is related in general to integrated circuits (ICs), and more particularly to an apparatus and method for bit line sensing in memory devices.

A static random access memory (SRAM) is a well-known memory device that is capable of storing millions of bits of information. Unlike the dynamic random access memory (DRAM) which requires a periodic refresh, the SRAM memory typically does not require a periodic refresh, thereby making it faster. The bits of information are stored in individual memory cells organized as an array of rows and columns to make efficient use of space on a semiconductor substrate used in the fabrication of the SRAM.

A well-known architecture in the design of a memory cell uses six metal oxide semiconductor (MOS) transistors, e.g., a 6T memory cell. Four transistors defining an SRAM cell core are configured as cross-coupled inverters, which act as a bistable circuit, retaining the state imposed onto it while being powered. Each inverter includes a load transistor and a driver transistor. The output of the two inverters is complementary to one another, except during transitions from one state to another. Two additional transistors known as "pass" or "access" transistors provide access to the cross-coupled inverters during a read operation (simply referred to as read) or write operation (simply referred to as write). The gate inputs of the pass transistors are typically connected in common to a "word line", or WL. The drain of one pass transistor is connected to a "bit line", or BL, while the drain of the other pass transistor is connected to the logical complement of the bit line, bit line bar, BLB, or BL_.

The 6T memory cell may be vulnerable to stability problems since the read and the write operation share some of the devices. Trend towards lower operating voltages and adoption of deep submicron technologies (e.g., below 65 nanometers) may exacerbate the problems. The stability problems often arise when stored charges on the internal storage nodes of the cell core are disturbed. In standard 6T memory cells, this may arise, for example, during a read operation in which an access transistor is connected to an internal node having a stored logical "0" (e.g., ground potential) associated therewith is activated with a logical "1" (e.g., high logic value) being present on the corresponding bit line. In this instance, the internal node is pulled above ground potential through the corresponding access transistor, which may unintentionally flip the logical state stored in the 6T memory cell. The stability of the 6T memory cell may be improved by adding two transistors, which generally results in an increase in the silicon area. An 8 transistor (8T) memory cell generally provides separate mechanisms to read data from the cell and write data to the cell, thereby enabling optimized performance and optimized sizing for the separate (or decoupled) read and write operations.

FIG. 1 illustrates an architecture of a traditional 8 transistor (8T) memory cell 100, according to prior art. In the depicted embodiment, a read circuit 102 for the 8T memory cell 100 includes a read access transistor 110, a read pull-down transistor 120 (also referred to as a read drive transistor), and a read bit line bar (RBLB) 130. A word line WL 104 is coupled to the gate of the read access transistor 110, thereby controlling its operation. The core cell 150 includes a first node T 152 to store a bit value, with a second node C 154 storing a complementary value relative to the first node T 152. The first node T 152 is coupled to the gate of the read pull-down transistor 120, thereby controlling its operation. A drain of the read pull-down transistor 120 is coupled to a source of the read access transistor 110, a source of the read pull-down transistor 120 is coupled to a ground level bias supply Vssm 160, e.g., 0.3 volts, and a drain of the read access transistor 110 is coupled to the RBLB 130.

The RBLB 130 is precharged to a logic high, e.g., 1.1 volts prior to the read operation. When a bit value stored at the first node T 152 is a logic high and when the word line WL 104 is asserted to a logic high, the read access transistor 110 and the read pull-down transistor 120 provide a low resistance path between RBLB 130 and Vssm 160, thereby pulling the RBLB 130 voltage below the precharge logic high voltage. When a bit value stored at the first node T 152 is a logic low or when the word line WL 104 is de-asserted to a logic low, at least one of the read access transistor 110 and the read pull-down transistor 120 is open, thereby electrically cutting off the conductive path between RBLB 130 and VSSM 160. This results in substantially retaining the voltage at RBLB 130, which is equal to the precharge logic high voltage (assuming negligible leakage current).

However, supply voltage improvements such as increasing supply voltage from a ground reference (not shown) Vss=0 volts to Vssm 160=0.3 volts (for providing increased forward bias) or increasing WL 104 from 1.1 volts to 1.4 volts, which may have been made to improve writability to the 8T memory cell or to reduce power consumption, often cause level shift problems (e.g., between periphery and the memory cell array) during sensing of voltage at RBLB 130. In addition, a low level voltage (e.g., Vssm=0.3 volts) at RBLB 130 is comparable to a threshold voltage (Vt) of a transistor and may not be easily differentiated from a high logic level across corners of an array or other reduced power voltages during the sensing operation. As a result, the performance of the traditional 8T memory cell may be reduced and may result in increased read errors.

SUMMARY

Applicants recognize that particular supply voltage improvements, e.g., Vssm=0.3 volts, may cause the leakage current of the inactive memory cells (Ioff) to be comparable with the on current drawn by an active cell (Ion), thereby potentially causing an inadvertent flip in the logic state stored in the 8T memory cell. For example, the assumption of negligible leakage current to retain the voltage at RBLB 130 may not be true if the gate of the pull-down transistor 120 is at Vssm. Applicants further recognize that sensing of a read bit line using a single-ended sense amplifier is susceptible to a ground reference mismatch (e.g., the single-ended sense amplifier being equal to Vss and the read circuit being equal to Vssm) and is also susceptible to noise. Therefore, it would be desirable to provide an improved 8T memory cell having a differential sense amplifier that accommodates supply voltage improvements, reduces the leakage current (Ioff) relative to the on current of the active cell, provides a faster read, reduces susceptibility to noise due to the differential operation where noise is common mode, and uses less silicon area. Accordingly, it would be desirable to provide a method and apparatus for improving performance and reducing silicon area of an 8T memory cell, absent the disadvantages found in the prior methods discussed above.

The foregoing need is addressed by the teachings of the present disclosure, which relates to an apparatus and method for reading a logic state stored in an 8T memory cell. According to one embodiment, in a method and apparatus for reading a logic state stored in an 8 transistor memory cell (8TMC), a differential sense circuit includes a differential input circuit having a pair of differential inputs and an output. An output signal is provided at the output and is indicative of a difference between two signals received at the pair of differential inputs. The difference is in accordance with the logic state read from the 8TMC. A sense amplifier is coupled to the output, the sense amplifier being operable to amplify the output signal that is greater than a threshold and switch the output signal to a voltage level corresponding to the logic state. The difference between the two signals measurable over a configurable time period is greater than a corresponding change in any one of the two signals measured over the same period, thereby improving the performance of the 8TMC.

In one aspect of the disclosure, a method for reading a logic state stored in an 8T memory cell includes coupling a soft ground level reference node of a read buffer of the 8T memory cell to one of two differential inputs of a differential sense amplifier. A second one of the two differential inputs is coupled to a read bit line of the read buffer. A differential voltage across the two differential inputs is detected to read the logic state, a change in the differential voltage being indicative of the logic state.

Several advantages are achieved by the method and system according to the illustrative embodiments presented herein. The embodiments advantageously provide an improved apparatus and method for reading a logic state stored in an 8T memory cell. The improved apparatus and method for reading data advantageously provides improved performance measurable in reduced time to read the data and reduced silicon area, especially when compared to the performance characteristics and silicon area of a traditional 8T memory cell. A differential measurement between two nodes that have voltages moving in opposing directions advantageously builds up the differential faster compared to sensing only one of the two nodes, thereby reducing the read time. Thus, the improved apparatus and method advantageously improves the design margins compared to a single-ended sense amplifier. Voltage at one of the two nodes is advantageously controlled in a selective manner, e.g., by connecting the node to a known reference such as Vssm during precharge and by disconnecting the node from the known reference Vssm after the precharge, thereby enabling the Vssref node to hold or accumulate charge. The sense amplifier advantageously builds up on the output signal that is greater than a threshold value and switches the output signal to a logic state corresponding to the stored state. The silicon area is improved by advantageously sharing the sense amplifier and pull-up circuits across multiple columns and by reducing the transistor count used in the differential circuits. The differential inputs are advantageously less susceptible to common mode noise. The improved apparatus and method advantageously resembles direct bit line sensing since output transitions if read bit line transitions, thereby providing improved performance. The sense amplifier is advantageously enhancing the performance of the direct bitline sensing method, and is not a primary component for logic functionality of the memory as a whole.

DETAILED DESCRIPTION

Figure 1:
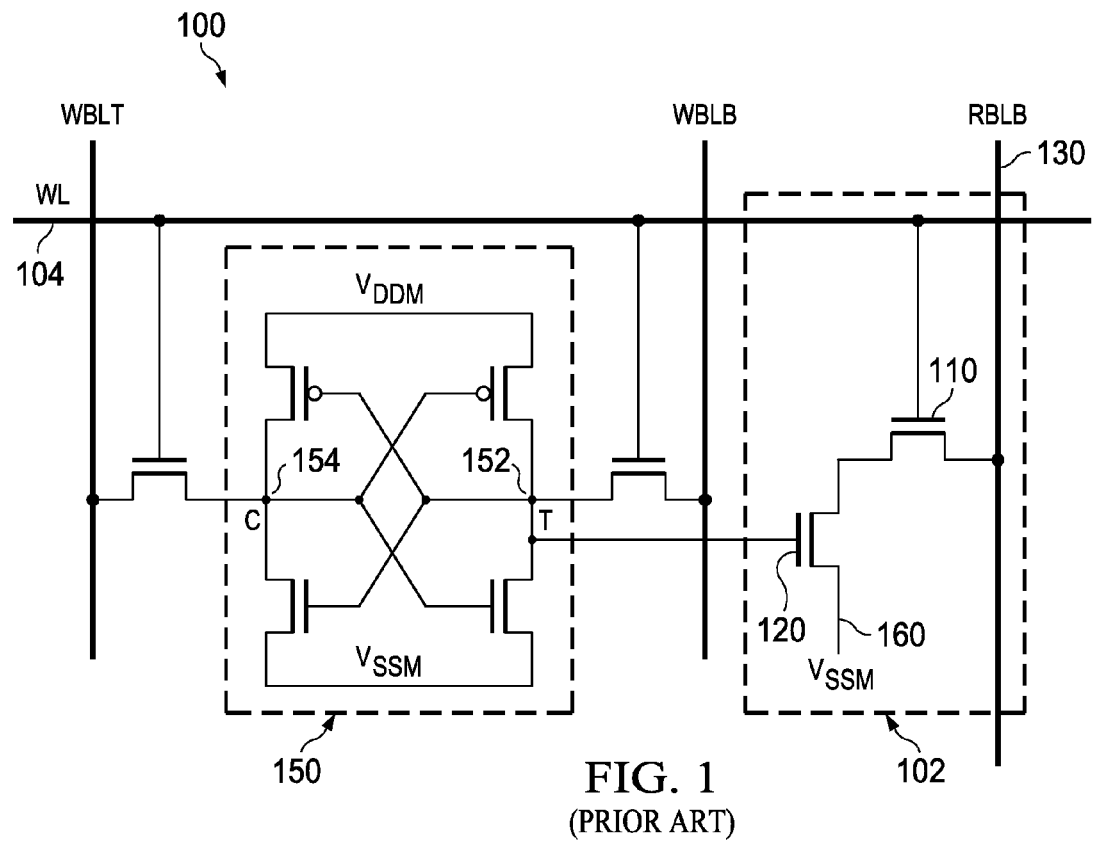
FIG. 1 is a simplified circuit diagram of an 8 transistor (8T) memory cell, described herein above, according to prior art.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, subassemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

Providing memory circuits having desirable characteristics for performance and silicon area has been a challenge since improvement in one parameter is often achieved at the cost of others. For example, multiple supply voltage levels have been implemented to improve writability to the 8T memory cell or to reduce power consumption. However, these changes often cause level shift problems during the read operation. The level shift may increase complexity and may require the use of voltage translator circuits, which may increase silicon area. As another example, increasing ground level supply from 0 volts to 0.3 volts may exceed Vt for some transistors, thereby increasing the leakage current. These problems, among others, may be addressed by an improved apparatus and method for reading data stored in the 8T memory cell. According to an embodiment, in a method and apparatus for reading a logic state stored in an 8 transistor memory cell (8TMC), a differential sense circuit includes a differential input circuit having a pair of differential inputs and an output. An output signal is provided at the output and is indicative of a difference between two signals received at the pair of differential inputs. The difference is in accordance with the logic state read from the 8TMC. A sense amplifier is coupled to the output, the sense amplifier being operable to amplify the output signal that is greater than a threshold and switch the output signal to a voltage level corresponding to the logic state. The difference between the two signals measurable over a configurable time period is greater than a corresponding change in any one of the two signals measured over the same period, thereby improving the performance of the 8TMC.

Figure 2A:
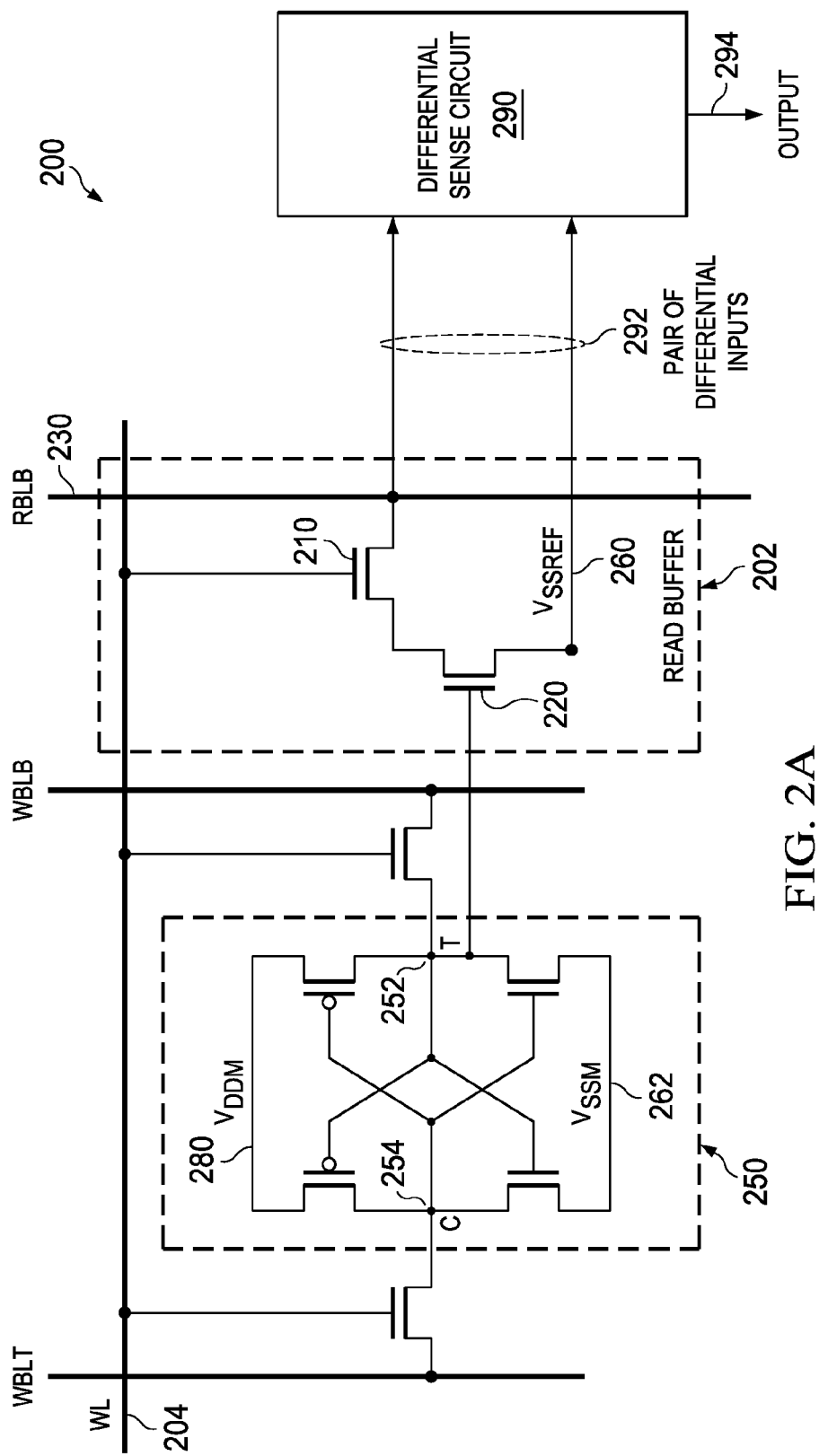
FIG. 2A is a simplified circuit diagram of an 8 transistor (8T) memory cell having a differential sense circuit, according to an embodiment.
Figure 2B:
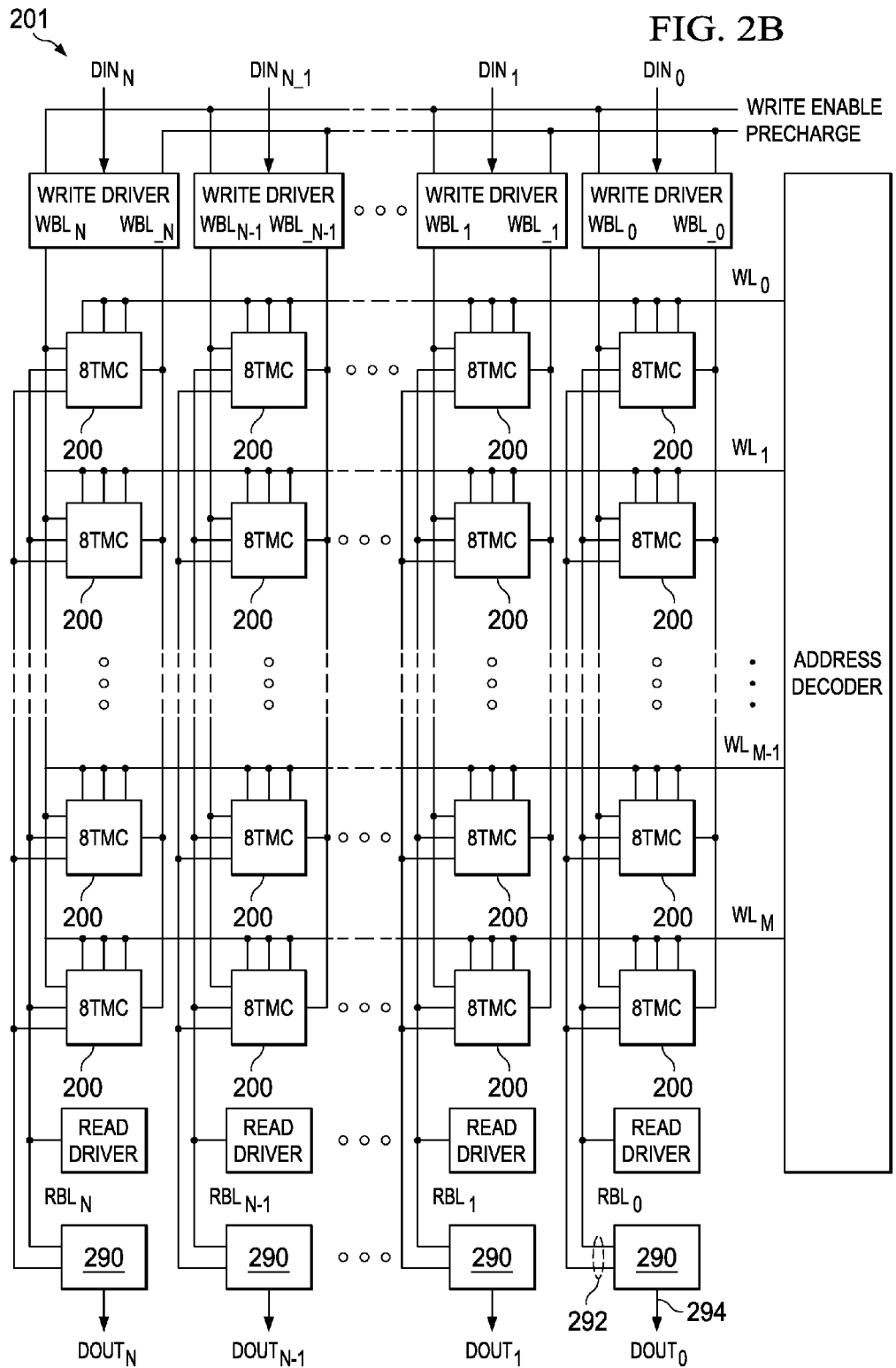
FIG. 2B is a simplified circuit diagram of a memory device having multiple ones of an 8T memory cell described with reference to FIG. 2A, according to an embodiment.

An 8T memory cell having a differential input for reading stored data is described with reference to FIG. 2A. A memory device having multiple ones of the 8T memory cell is described with reference to FIG. 2B. Additional detail of a differential sense amplifier having differential inputs is described with reference to FIGS. 3A, 3B, 3C and 3D. Timing aspects of reading data stored in the 8T memory cell described with reference to FIGS. 2A, 2B, 3A, 3B, 3C, and 3D is described with reference to FIGS. 4A, 4B, and 4C. A method for reading a logic state stored in the 8T memory cell described with reference to FIGS. 2A and 2B is described with reference to FIG. 5.

The following terminology may be useful in understanding the present disclosure. It is to be understood that the terminology described herein is for the purpose of description and should not be regarded as limiting.

Semiconductor Device—A semiconductor device is an electronic component that utilizes electronic properties of semiconductor materials to perform a desired function. A semiconductor device may be manufactured as a single discrete device or as one or more integrated circuits (ICs) packaged into a module.

Differential Input—A pair of inputs in which each one of the pair of inputs is electrically floating with respective to a ground reference, the ground reference being used by an input circuit that is operable to receive the pair of inputs.

Configuration—Describes a set up of an element, a circuit, a package, an electronic device, and similar other, and refers to a process for setting, defining, or selecting particular properties, parameters, or attributes of the device prior to or during its use or operation. Some configuration attributes may be selected to have a default value. For example, a desired number of columns sharing a common sense amplifier circuit may be configured to be equal to 4. As another example, a deliberate offset circuit may be configured to introduce a bias voltage of 60 millivolts between the two nodes of a cross-coupled inverter.

FIG. 2A is a simplified circuit diagram of an 8 transistor (8T) memory cell 200 having a differential sense circuit 290, according to an embodiment. In the depicted embodiment, a read buffer 202 for the 8T memory cell 200 includes a read access transistor 210, a read pull-down transistor 220 (also referred to as a read drive transistor), and a read bit line bar (RBLB) 230. A word line WL 204 is coupled to the gate of the read access transistor 210, thereby controlling its operation. The core cell 250 includes a first node T 252 to store a bit value, with a second node C 254 storing a complementary value compared to the first node T 252. The first node T 252 is coupled to the gate of the read pull-down transistor 220, thereby controlling its operation. A drain of the read pull-down transistor 220 is coupled to a source of the read access transistor 210, a source of the read pull-down transistor 220 is coupled to a soft ground level reference node Vssref 260, and a drain of the read access transistor 210 is coupled to the RBLB 230. A first power source Vddm 280 and a ground level bias supply Vssm 262 provide power to the core cell 250. Nominal operating voltages for Vddm 280 and Vssm 262 are 1.1 volts and 0.3 volts respectively. In a particular embodiment, a voltage level at the soft ground level reference node Vssref 260 is advantageously controllable. Additional details of controlling the voltage level of Vssref 260 is described with reference to FIG. 3.

Referring back to FIG. 2A, the differential sense circuit 290 includes a pair of differential inputs 292 and an output 294. The differential inputs are advantageously less susceptible to common mode noise compared to single-ended inputs used in an input sensing circuit of the traditional 8T memory cell 100. A first one of the pair of differential inputs 292 is coupled to RBLB 230 and a second one of the pair of differential inputs 292 is coupled to Vssref 260. The differential sense circuit 290 provides an output signal at the output 294, the output signal being indicative of a difference between two signals received at the pair of differential inputs 292. The difference, and hence the output signal, is in accordance with a logic state (one of a high logic level or a low logic level) read from the 8T memory cell 200. That is, in a particular embodiment, the difference is less than a threshold when a low logic level is read and the difference is greater than the threshold when a low logic level is read.

Prior to the read, RBLB 230 is precharged to a logic high, e.g., 1.1 volts, and Vssref 260 is precharged during initialization to Vssm 262, e.g., 0.3 volts, prior to the read operation. The Vssref 260 is disconnected from Vssm 262 at the end of initialization and prior to the read. When a bit value stored at the first node T 252 is a high logic level and when the word line WL 204 is asserted to a high logic level, the read access transistor 210 and the read pull-down transistor 220 provide a low resistance path between RBLB 230 and Vssref 260, thereby pulling the RBLB 230 voltage below the precharge high logic level and simultaneously pulling the voltage of Vssref 260 above Vssm 262. That is, the voltage at RBLB 230 is decreasing while the voltage at Vssref 260 is concurrently increasing, e.g., moving in opposing directions. A difference (or differential) in the voltages between RBLB 230 and Vssref 260 received by the pair of differential inputs 292 is rapidly decreasing. A rate of change in the difference is greater than the change in RBLB 230 alone or the change in Vssref 260 alone measured over a configurable period of time. Thus, the differential measurement based technique which uses the pair of differential inputs 292 to rapidly build up the differential advantageously reduces the time to read the logic state compared to the traditional 8T memory cell 100 which uses slower changing, single-ended measurement technique. The output signal provided at the output 294 changes in accordance with the differential.

When a bit value stored at the first node T 252 is a logic low or when the word line WL 204 is de-asserted to a low logic level, at least one of the read access transistor 210 and the read pull-down transistor 220 is open, thereby electrically cutting off the conductive path between RBLB 130 and Vssref 260. This results in the RBLB 130 retaining the voltage to the precharge level, e.g., 1.1 volts, since there is no conductive path to share the charge. Similarly, charge at Vssref 260 is retained at the precharge level of Vssm 262, e.g., 0.3 volts, since there is no conductive path to share the charge. Leakage current is minimized since Vssref 260 discharge pull down shuts off leakage path, e.g., by use of a long length n-MOS device to control the voltage at Vssref 260. Therefore, in a read "0" operation voltage levels on the differential input side and on the output remain substantially unchanged, e.g., voltage levels are within a configurable threshold level. In a particular embodiment, a difference (or differential) in the voltages between RBLB 230 and Vssref 260 received by the pair of differential inputs 292 during the precharge (before read operation) and during the read operation is substantially constant, e.g., about 0.8 volts. That is, a change in the differential is held within a configurable threshold level (may be plus or minus) of 0.8 volts. Similarly, a change in the output signal, which changes in accordance with the differential, is also held within a configurable threshold level.

In an exemplary, non-depicted embodiment, the 8T memory cell 200 is included in an electronic device such as a cellular phone, a digital camera/camcorder, a pocket computer, a laptop computer, a personal entertainment device or any other similar portable, battery operated device. The electronic devices include multiple chips such as microprocessors, digital signal processors, radio frequency circuits, memory, microcontrollers such as input/output controllers, and the like, along with the 8T memory cell 200.

FIG. 2B is a simplified circuit diagram of a memory device 201 having multiple ones of the 8T memory cell 200 described with reference to FIG. 2A, according to an embodiment. In the depicted embodiment, the memory device 201 includes multiple ones of the 8T memory cell 200 that are organized in an array of a plurality of rows, e.g., m rows, and a plurality of columns, e.g., n columns. The memory device 201 includes address decoders, a plurality of write drivers, multiple ones of the differential sense circuit 290 described with reference to FIG. 2A, read drivers, and the array of the 8T memory cell 200. Address decoder outputs a number of word lines, WL0, WL1, up to WLm-1, and WLm, connecting each of m rows of the 8T memory cell 200. Each write driver generates a WBL and WBLB signal, these signals connect 8T memory cell in one of n columns as determined by the column select, the column select signal (ColSel0 through ColSelN) being generated from the column address provided to access the memory device 101. In this manner, each one of the 8T memory cell may be written to and read from by configuring a particular value for m and n.

Figure 3D:
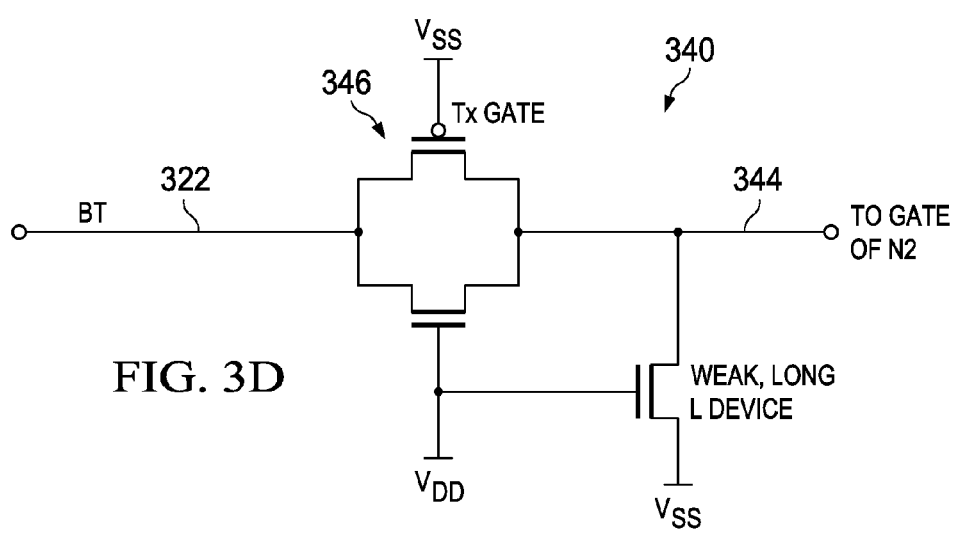
FIG. 3D is a simplified circuit diagram of a deliberate offset circuit described with reference to FIG. 3A, according to an embodiment.
Figure 3A:
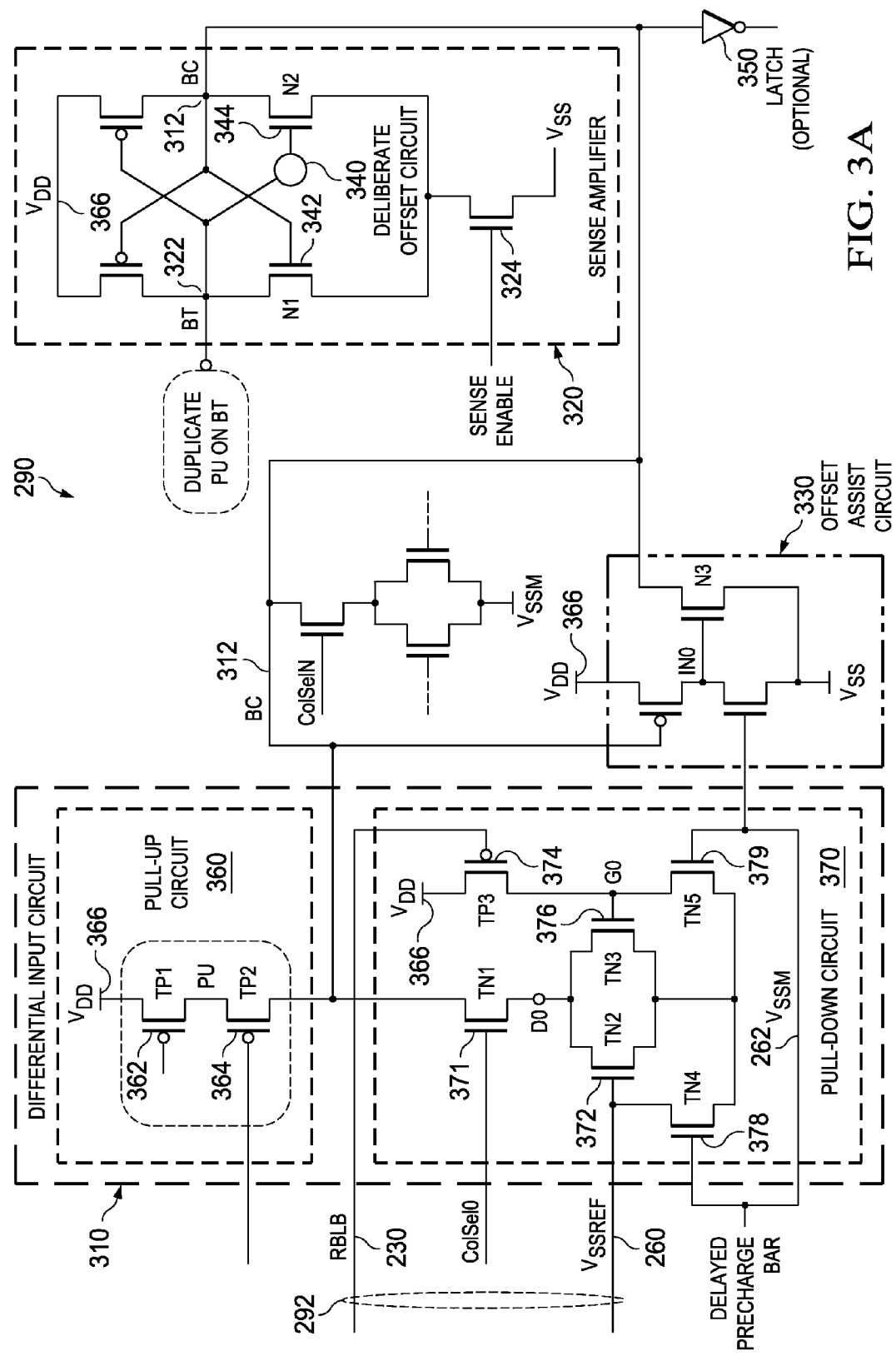
FIG. 3A is a simplified circuit diagram illustrating further details of a differential sense circuit described with reference to FIGS. 2A and 2B, according to an embodiment.

FIG. 3A is a simplified circuit diagram illustrating further details of the differential sense circuit 290 described with reference to FIGS. 2A and 2B, according to an embodiment. In the depicted embodiment, the differential sense circuit 290 includes a differential input circuit 310, a sense amplifier 320, an offset assist circuit 330, a deliberate offset circuit 340, and an optional latch 350. The differential input circuit 310 includes the pair of differential inputs 292 operable to receive differentials input signals from Vssref 260 and RBLB 230. The differential input circuit 310 provides an output signal at an output node BC 312 in response to the differential input signals. In a particular embodiment, BC 312 is the same as the output 294 described with reference to FIG. 2A. As described earlier, the sense amplifier 320 is operable to detect a condition in which a change in the output signal at the output node BC 312, which is in accordance of the differential, is greater than a threshold. The sense amplifier 320 is operable to amplify the change by switching the output signal to a voltage level corresponding to the logic state.

In a particular embodiment, the differential input circuit 310 includes a pull-up circuit 360 and a pull-down circuit 370. The pull-up circuit 360 provides logic to pull up BC 312 during an initialization phase to a high logic level. The pull-up circuit 360 may be shared between a configurable number of a plurality of columns of the memory device 201, which includes multiple ones of the 8T memory cell 200. The shared arrangement advantageously reduces loading or power consumption, and reduces silicon area. In the depicted embodiment, the pull-up circuit 360 includes a switch TP1 controlled by a delayed precharge signal 362 coupled in series with a switch TP2 controlled by a prechargebar signal 364. The pull-up circuit 360 is powered by Vdd 366.

The pull-down circuit 370 includes logic to receive the differential input signals at the pair of differential inputs 292 corresponding to a selected column, adjust the output signal at BC 312 in response to the differential input signal, and logic to control a voltage level at the soft ground level reference node Vssref 260, e.g., by switching on or off a switch TN4 378 disposed between Vssref 260 and the ground level bias supply voltage Vssm 262 provided to the 8T memory cell 200.

In the depicted embodiment, the pull-down circuit 370 includes a column select switch TN1 371 (controlled by Colsel0) coupled to the output BC 312, the column select switch TN1 371 corresponding to a selected one of the plurality of columns. A first input switch TN2 372, which is coupled to the column select switch, has a first gate coupled to a first one of the pair of differential inputs 292. The first gate is coupled to Vssref 260. A second input switch TP3 374 includes a second gate that is coupled to a second one of the pair of differential inputs 292. The second gate is coupled to RBLB 230. The TP3 374 is powered by Vdd 366. A gate switch TN3 376 includes a gate that is coupled to the second input switch TP3 374. The gate switch TN3 376 is operable to couple the second input switch TP3 374 to the column select switch TN1 371. An initialization circuit includes a first initialization switch TN4 378 and a second initialization switch TN5 379. The gate of TN3 376, the drain of TN5 379, and the source of TP3 374 are coupled to form a node G0. The first initialization switch TN4 378 is operable to equalize voltages at the soft ground level reference node Vssref 260, the gate of the gate switch TN3 376, and Vssm 262 during an initialization phase. Additional details of the timing aspects of the 8T memory cell 200 are described with reference to FIGS. 4A, 4B, and 4C.

As described earlier, prior to a read operation, TN4 378 is opened to disconnect Vssref 260 from Vssm 262, thereby enabling Vssref 260 to retain charge corresponding to Vssm 262. During initialization TN4 378 and TN5 379 are turned on (being controlled by delayed precharge bar signal that is complementary to the delayed precharge signal 362) and TN2 372, TN3 376, and TP3 374 are turned off. After asserting column select signal ColSel0, the switch TN1 371 is on. Node D0 voltage increases to voltage at BC 312 less Vds of switch TN1 371. Before read is enabled, e.g., before WL 204 is asserted, RBLB 230 is at a high logic level, e.g., 1.1 volts and Vssref 260 is at Vssm 262, e.g., 0.3 volts.

If a logic state having a high logic level is read from node T 252 and WL 204 is asserted then path between RBLB 230 and Vssref 260 is enabled, thereby allowing equalization of charges there between and enabling the differential input signal received at the pair of differential inputs 292 to change rapidly. Change in the differential input causes TN2 372, TN3 376, and TP3 374 to close, thereby pulling down voltage level of BC 312, the change being above a threshold level.

If a logic state having a low logic level is read from node T 252 and WL 204 is asserted then path between RBLB 230 and Vssref 260 is disabled, thereby disabling equalization of charges there between. The differential input signal received at the pair of differential inputs 292 is substantially constant. A lack of change in the differential input causes TN2 372, TN3 376, and TP3 374 to remain open, thereby substantially retaining voltage level of BC 312, the change being below a threshold level.

In the depicted embodiment, the sense amplifier 320 includes a pair of cross-coupled inverters (including n-MOS switches N1 342 and N2 344) forming two nodes. In a particular embodiment, the sense amplifier 320 may be shared between a selected number of columns, e.g., 4 columns, of the memory device 201, thereby advantageously reducing power consumption and silicon area. A first one of the two nodes is coupled to the output BC 312 and a second one of the two nodes is an output BT 322. In an exemplary, non-depicted embodiment, the output BT 322 is coupled to a pull-up circuit, which may be similar to or the same as the pull-up circuit 360. During the initialization process, the pull-up circuit associated with BT 322 precharges it to a high logic level (similar to BC 322). When the stored value of a high logic level is read, the change in BC 312 is greater than the threshold and this causes the cross-coupled inverters to switch the BC 312 output to a low logic level and the BT 322 to a high logic level. Thus, the cross-coupled inverters are operable to amplify the output signal at BC 312 to a low logic state in accordance with the difference, the difference being greater than the threshold. The logic state of BC 312 may be stored in the optional latch 350 for further use.

In the depicted embodiment, the sense amplifier 320 includes a deliberate offset circuit 340. It is well known that transistors, e.g., N1 342 and N2 344, used in the pair of cross coupled inverters included in the sense amplifier 320 may not be matched. As a result, an offset voltage, which may vary between transistors, may exist between the nodes BC 312 and BT 322. When a low logical value is read from node T 252 and the sense enable switch 324 is turned on, the state of BC 312 and BT 322 may not be predictable since it is dependent on the variable offset. The deliberate offset circuit 340 is operable to force the pair of inverters to a known state to predictably accommodate the transistor mismatch.

The sense amplifier 320 is controlled by a sense enable switch 324. The timing of the sense enable switch 324 is configured to allow a sufficient build up of voltage in the differential that is greater than the threshold and is fast enough to provide improved read time compared to the 8T memory cell 100. The improved apparatus and method advantageously resembles direct bit line sensing since the output BC 312 transitions if RBLB 230 transitions, thereby providing improved performance.

As described earlier, reading a high logic state from the 8T memory cell 200 causes RBLB 230 transition towards a low and BC 312 transitions towards a logic low, with the sense amplier 320 amplifying the difference to make the transition faster when turned on. However, when reading a logic state of low from the 8T memory cell 200, the voltage level of RBLB 230 and BC312 remain substantially constant. That is, there is no transition on RBLB 230 and BC312. By introducing a deliberate offset using the deliberate offset circuit 340 in the sense amplifier 320, the sense amplifier 320 is advantageously made more robust so as to disable BC transition even if there were small drifts on BC 312 from its precharged state. Thus when the sense amplifier 320 is turned on when reading a low logic state, the deliberate offset circuit 340 ensures that BT 322 transitions low and BC 312 does not transition. If the sense amplifier 320 is removed from the depicted embodiment, BC312 will respond just the same way as without it, except that it would be slower. The cost of introducing the deliberate offset is that the enabling of sense amplifier 320 for the case of BC312 transitioning towards low will have to wait till BC312 discharges by an amount, equal to the sum of the mismatch on the sense amplifier transistors N1 342, and N2 344 AND the deliberate offset. While in the conventional sense amplifier based design, the differential at the sense amplifier inputs is developed by a very weak memory cell working on the large load of bitlines, in this case the BC 312 node is relatively very lightly loaded and is driven by relatively much stronger transistors TN1 371, TN2 372, TN3 376. Hence development of the extra differential corresponding to the deliberate offset discussed above is very quick. Thus, the proposed scheme is a direct bit line sensing method with improved performance due to assistance from sense amplifier 320 operation. It does not necessarily depend on the sense amplifier 320 operation for logic functionality. The BC 312 signal will transition if RBLB 230 transitions, else it will stay precharged. In a conventional sense amplifier based design, either bit line or bit line bar goes towards low and the sense output is a function of the signal, either bit line or bit line bar, that transitions.

The deliberate offset circuit 340 is operable to force a second one of the two nodes, e.g., BT 322, to have a voltage offset relative to the first one, e.g., BC 312. The deliberate voltage offset causes the pair of cross-coupled inverters to store the logic state read from the 8T memory cell in accordance with the difference, the difference being less than the threshold. That is, when the difference is less than the threshold the deliberate voltage offset causes BT 322 to be driven to low logic level when reading a low logic level stored in the 8T memory cell 200. Additional detail of the deliberate offset circuit 340 is described with reference to FIG. 3D.

In the depicted embodiment, the offset assist circuit 330, which is coupled to the differential input circuit 310, is operable to accelerate a change in a voltage level of the output signal at BC 312 in response to the difference being greater than the threshold. The offset assist circuit 330 is advantageously operable during a read of a high logic level stored at node T 252, e.g., read "1", but is disabled when reading a low logic level, e.g., read "0", from the same node. When BC 312 is pulled lower due to the presence of the differential input signal, the N3 switch is turned on to quickly pull down the output voltage signal at BC 312 towards Vss, e.g., ground reference.

Figure 3B:
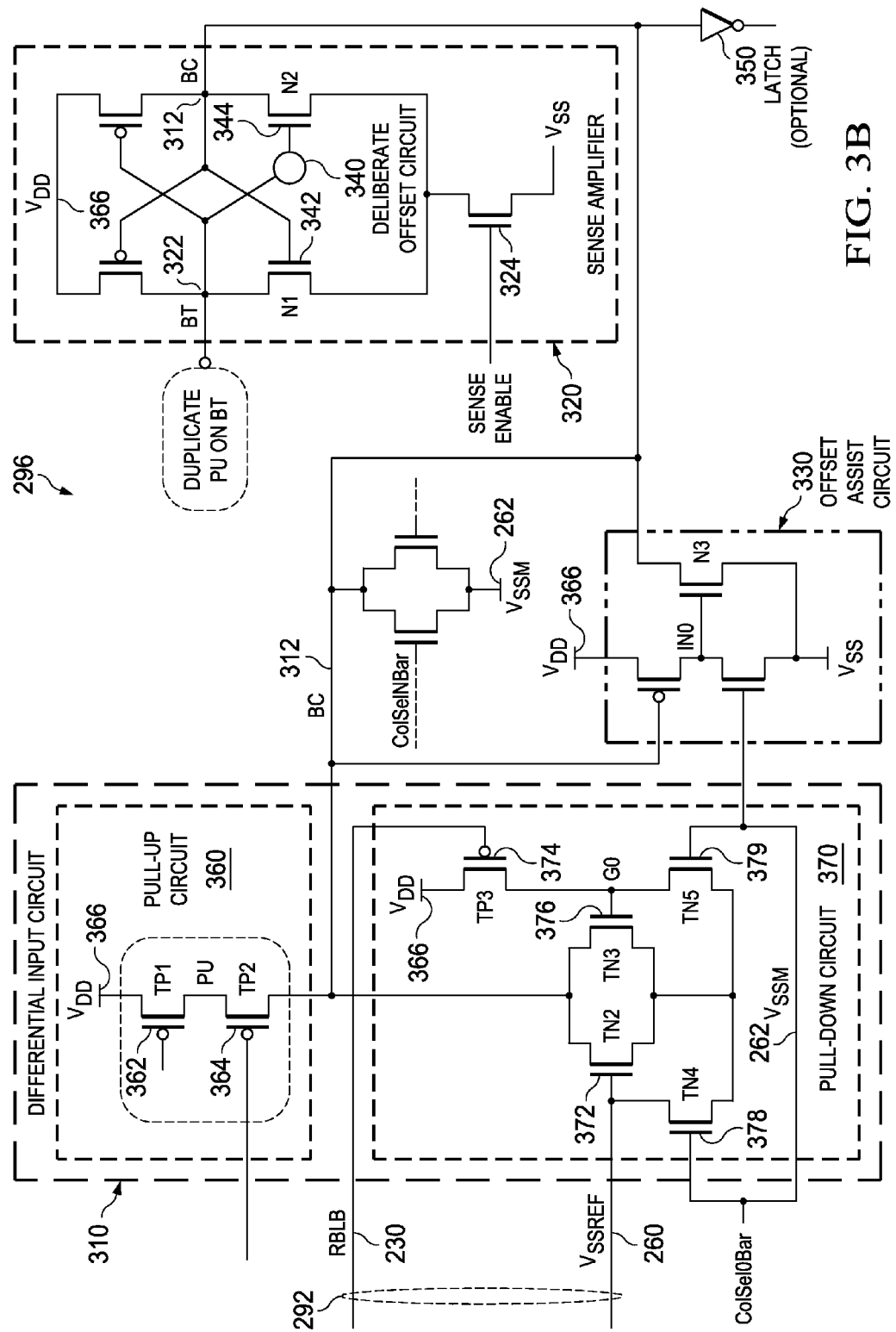
FIG. 3B is a simplified circuit diagram illustrating further details of a differential sense circuit having improved performance and reduced silicon area, according to an embodiment.

FIG. 3B is a simplified circuit diagram illustrating further details of a differential sense circuit 296 having improved performance and reduced silicon area, according to an embodiment. In the depicted embodiment, the differential sense circuit 296 is substantially similar to the differential sense circuit 290 described with reference to FIGS. 2A and 2B except for the switch TN1 371 corresponding to ColSel-Bar signal to select column 0. Switches corresponding to other columns e.g., ColSelN, are also removed. The unselected columns remain initialized due to high level on Colsel-Bar input, hence BC 312 is not affected. TN4 378 and TN5 379 are controlled by ColSel0 signal instead of the delayed precharge bar signal. The removal of the switch TN1 371 while substantially preserving the logic and timing sequence of the read operation provides improved performance and reduced silicon area compared to the differential sense circuit 290.

Figure 3C:
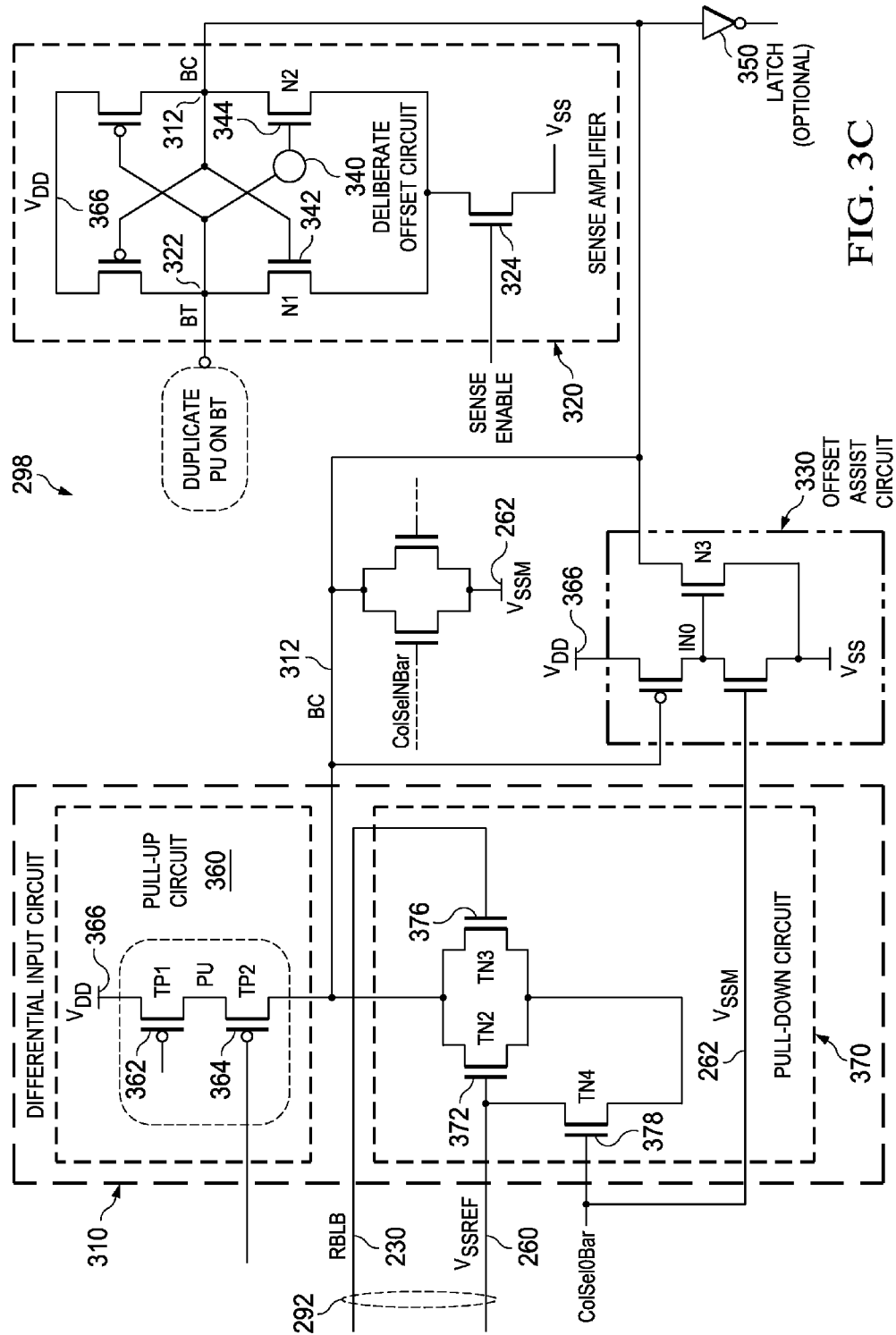
FIG. 3C is a simplified circuit diagram illustrating further details of a differential sense circuit having improved performance and further reduced silicon area, according to an embodiment.

FIG. 3C is a simplified circuit diagram illustrating further details of another differential sense circuit 298 having improved performance and reduced silicon area, according to an embodiment. In the depicted embodiment, the differential sense circuit 298 is substantially similar to the differential sense circuit 290 described with reference to FIGS. 2A and 2B except for the switches TN1 371, TP3 374 and TN5 379. The removal of the switches TN1 371, TP3 374 and TN5 379 while preserving a majority of the logic and timing sequence of the read operation provides improved performance and further reduction in silicon area compared to the differential sense circuit 290.

FIG. 3D is a simplified circuit diagram of the deliberate offset circuit 340 described with reference to FIG. 3A, according to an embodiment. Referring to FIGS. 3A and 3D, the pair of cross coupled inverters of the sense amplifier 320 include pull-down transistors N1 342 and N2 344. A transmission gate 346 is coupled in series between BT 322 and a gate N2 344 so that the gate of N2 344 is at lower voltage than the gate of N1 342 when sense amplifier 340 is turned on. The deliberate offset may be configured to have a value of approximately 30 millivolts, which is approximately equal to Vds of the transmission gate 346. Three-sigma variability in transistors attributed to random dopant fluctuation (RDF), is about 30 millivolts. Therefore, a change in the output signal voltage at BC 312 that is great than 60 millivolts (plus a configurable safety margin) is capable of overcoming the offset and switching BC 312 to a low logic level when reading a "1". In a particular embodiment, the change in the output signal voltage at BC 312 that is sufficient to overcome the threshold voltage may be configured to be approximately 300 millivolts.

Figure 4A:
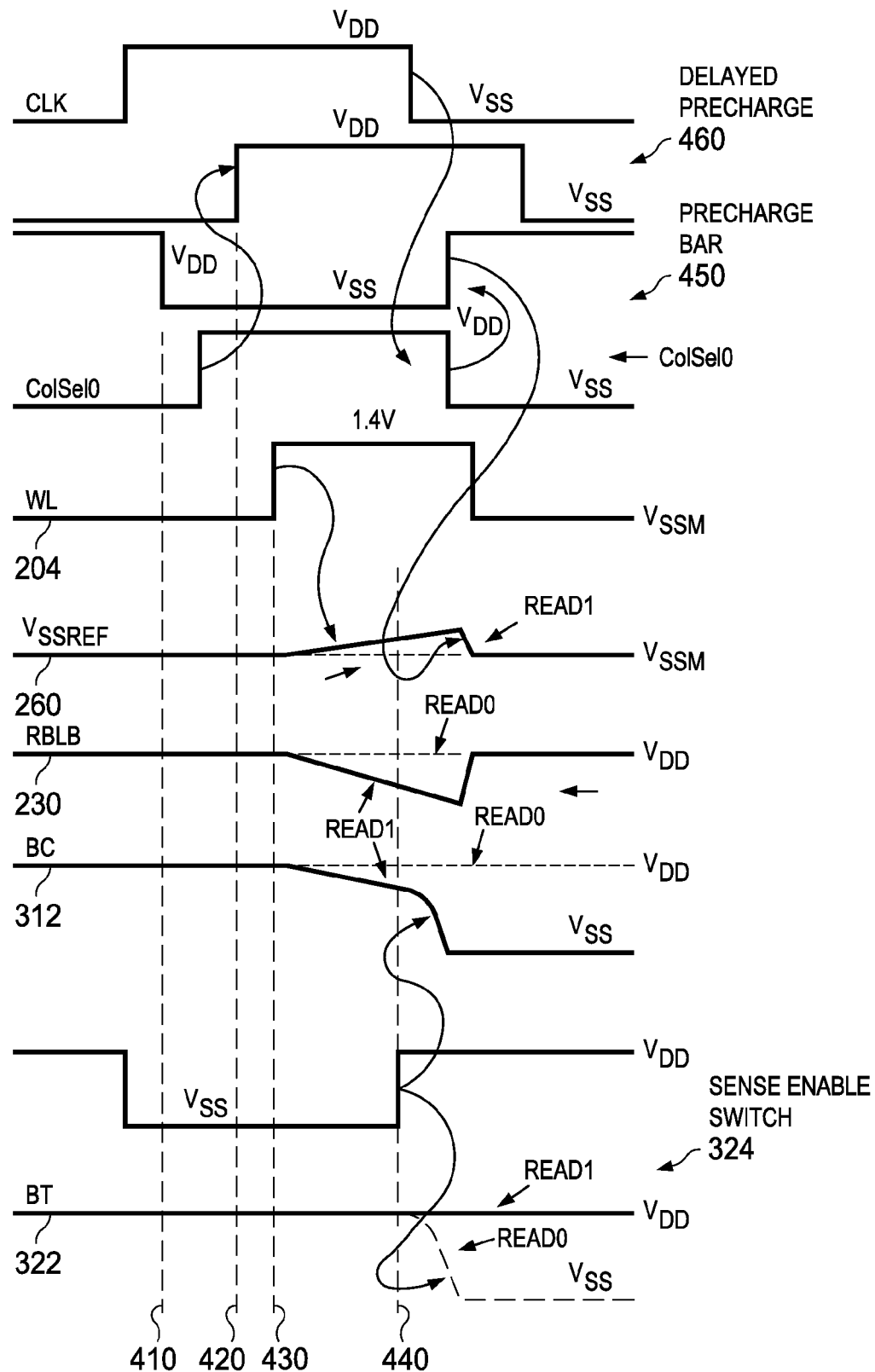
FIGS. 4A, 4B, and 4C illustrate waveforms associated with an 8T memory cell described with reference to FIGS. 2A, 2B, and 3A, 3B, 3C, and 3D, according to an embodiment.
Figure 4B:
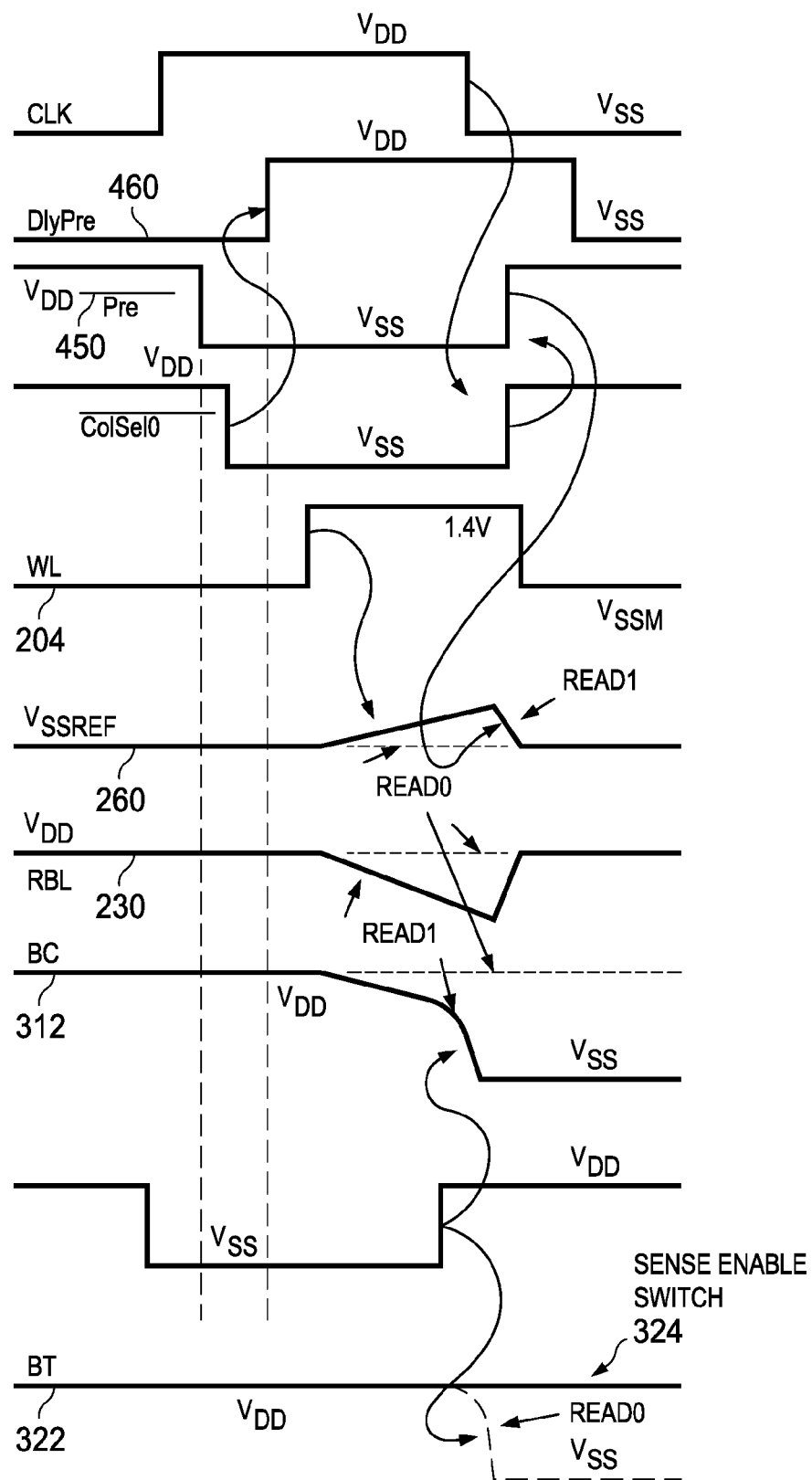
Figure 4C:
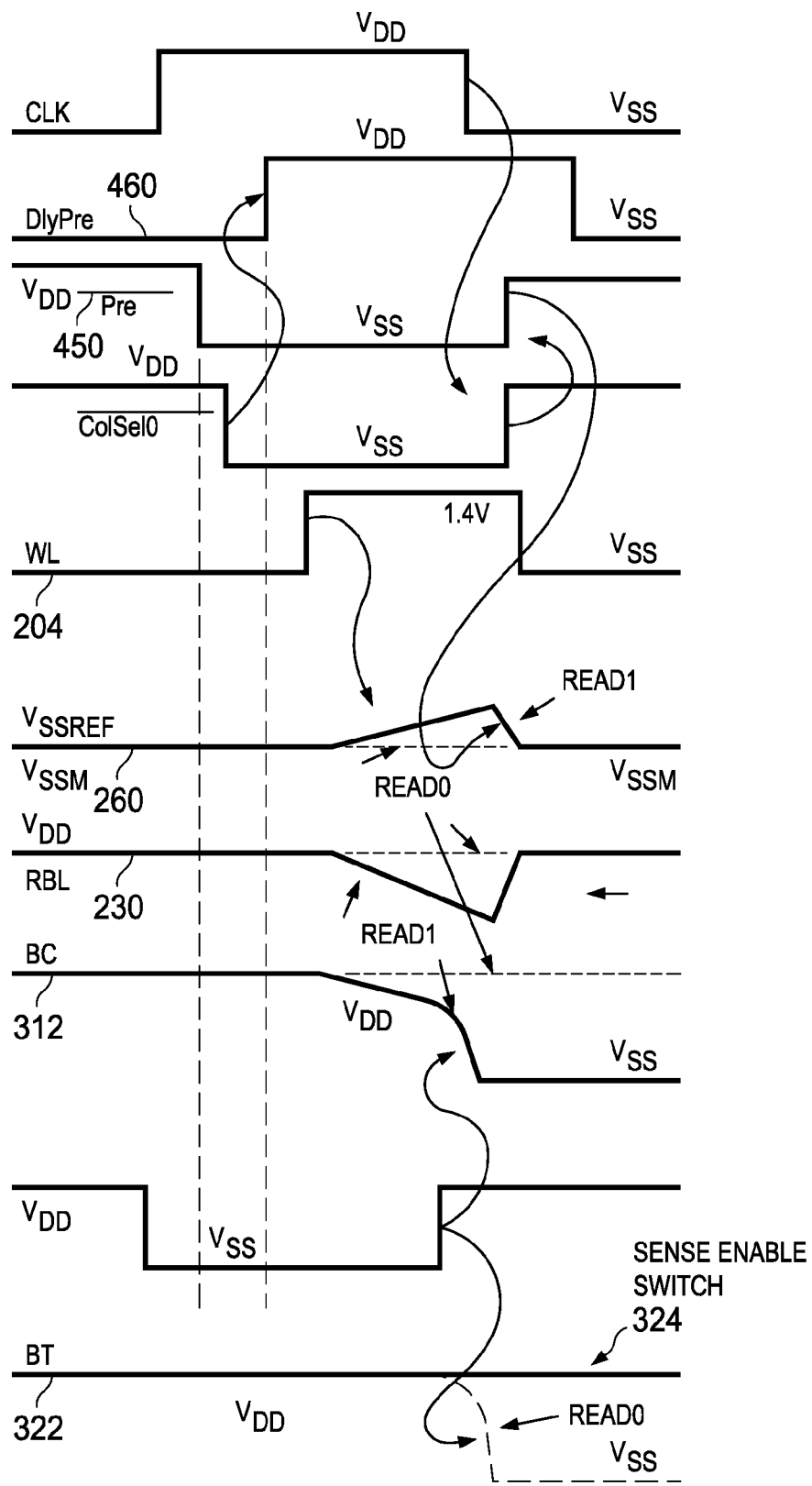

FIGS. 4A, 4B, and 4C illustrate waveforms associated with the 8T memory cell 200 described with reference to FIGS. 2A, 2B, and 3A, 3B, 3C, and 3D, according to one embodiment. Referring to FIG. 4A, at time t=$t_0$ 410, a prechargebar signal 450 is de-asserted to initiate the initialization phase. Arrows shown on the timing diagram between the various waveforms are indicative of a cause and effect relationship. At time t=$t_1$ 420, after a particular column is selected to perform a read operation, e.g., by de-asserting ColSel0bar, a delayed precharge signal 460 is asserted to pull-up BC 312 to a high logic level, pull-up BT 322 to a high logic level, precharge RBL signal 470 to a high logic level, and equate Vssref 260 to Vssm 262. The initialization phase is completed before time t=$t_2$ 430. At time t=$t_2$ 430, the WL 204 is asserted to initiate the read operation.

If a high level voltage is read from node T 252 then voltage at Vssref 260 rapidly ramps up and the voltage at RBLB 230 rapidly ramps down until t=$t_3$ 440. At t=$t_3$ 440 the sense enable switch 324 is turned on, thereby turning on the sense amplifier 320. The sense amplifier 320 detects the differential to be greater than a threshold and rapidly changes the voltage at BC 312 to a low logic level (a slope of the voltage signal at BC 312 before the sense enable switch 324 is turned on is gradual compared to a steeper slope after the sense enable switch 324 is turned on). Thus, the differential measurement between two nodes RBLB 230 and Vssref 260 that have voltages moving in opposing directions advantageously builds up the differential faster compared to sensing only one of the two nodes, thereby reducing the read time.

If a low level voltage is read from node T 252 then voltage at Vssref 260 and the voltage at RBLB 230 stay substantially constant. At t=$t_3$ 440, when the sense enable switch 324 is turned on, the sense amplifier 320 is also turned on, thereby making BT 322 transition to low by virtue of the deliberate offset introduced to favor BT 322 transition. The deliberate offset should be slightly more than the 3 sigma offset between the transistors N1 342 and N2 344, so that it favors a transition of BT 322 while reading a logic low level from node T 252 (e.g. if 3 sigma mismatch value is 30 mV, then deliberate value may be set to 35 mV, so that when sense amplifier 320 turns on, the excess over 3 sigma mismatch favors BT transition to low. However, this also means that the sense amplifier 320 turn on should be timed such that, while reading a logic high state from the memory cell T252 node, BC 312 should have transitioned by at least 65 mV down from its precharged level. The voltage offset causes BT 322 to switch to a low logic level and BC 312 to remain at a high logic level in response to the read "0" operation. A new value may be read from the node T 252 during the next cycle of the clock (CLK).

FIGS. 4B and 4C illustrate waveforms that are substantially similar to the waveforms described with reference to FIG. 4A. The particular control signals used for controlling the timing and logic of the differential sense circuit 296 and differential sense circuit 298 may vary.

Figure 5:
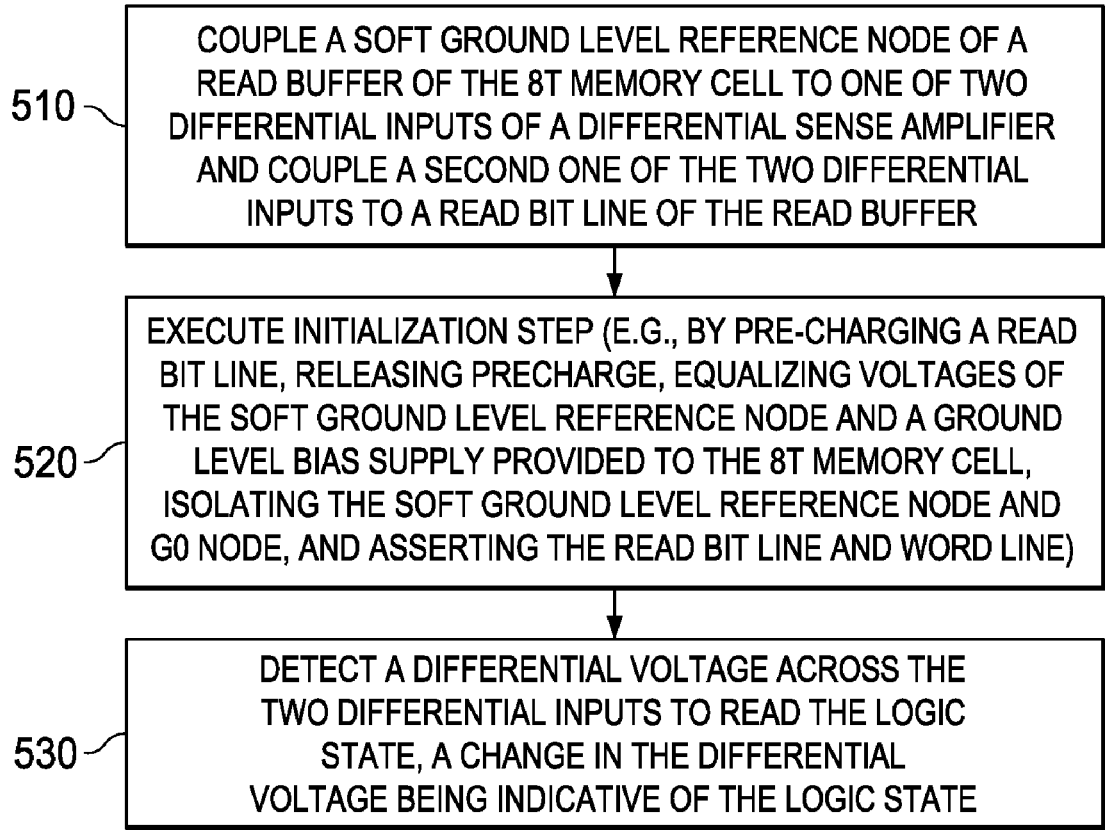
FIG. 5 is a flow chart illustrating a method for reading a logic state stored in an 8T memory cell, according to an embodiment.

FIG. 5 is a flow chart illustrating a method for reading a logic state stored in an 8T memory cell, according to an embodiment. In a particular embodiment, FIG. 5 illustrates the method for reading the logic state stored in the 8T memory cell described with reference to FIGS. 2A, 2B, 3A, 3B, 3C, 3D and 4. At step 510, a soft ground level reference node of a read buffer of the 8T memory cell is coupled to one of two differential inputs of a differential sense amplifier. A second one of the two differential inputs is coupled to a read bit line of the read buffer. At step 530, a differential voltage across the two differential inputs is detected to read the logic state, a change in the differential voltage being indicative of the logic state.

Various steps described above may be added, omitted, combined, altered, or performed in different orders. For example, an initialization step 520 is added before step 530 to initialize various voltage levels. In a particular embodiment, at step 520, the initialization step may include sub steps such as precharging a read bit line, releasing the precharge on the read bit line, equalizing voltages of the soft ground level reference node and a ground level bias supply provided to the 8T memory cell, once equalized turning off switches to isolate the soft ground level reference node and node G0 from Vssm, and asserting the read bit line and word line. After the initialization step, the input transistors, e.g., TN2 372 and TN3 376, are operable to receive the differential inputs.

Several advantages are achieved by the method and system according to the illustrative embodiments presented herein. The embodiments advantageously provide an improved apparatus and method for reading a logic state stored in an 8T memory cell. The improved apparatus and method for reading data advantageously provides improved performance measurable in reduced time to read the data and reduced silicon area, especially when compared to the performance characteristics and silicon area of a traditional 8T memory cell. A differential measurement between two nodes that have voltages moving in opposing directions advantageously builds up the differential faster compared to sensing only one of the two nodes, thereby reducing the read time. This is particularly true when apportioning of mismatch between the sense amplifier 320 transistors N1 342 and N2 344 is considered in line with laws of probability and statistics, rather than lump all of the 3 sigma mismatch onto one of them. Thus, the improved apparatus and method advantageously improves the design margins compared to a single-ended sense amplifier. Voltage at one of the two nodes is advantageously controlled in a selective manner, e.g., by connecting the node to a known reference such as Vssm during precharge and by disconnecting the node from the known reference Vssm after the precharge, thereby enabling the Vssref node to hold or accumulate charge. The sense amplifier advantageously builds up on the differential signal that is greater than a threshold value and switches the differential signal to a logic state corresponding to the stored state. The silicon area is improved by advantageously sharing the sense amplifier and pull-up circuits across multiple columns and by reducing the transistor count used in the differential circuits. The differential inputs are advantageously less susceptible to common mode noise. The improved apparatus and method advantageously resembles direct bit line sensing since output transitions if read bit line transitions, thereby providing improved performance. The sense amplifier is advantageously enhancing the performance of the direct bitline sensing method, and is not a primary component for logic functionality of the memory as a whole.

The reason why direct bitline sensing is faster than sense amplifier based designs is because of the Central limit theorem of probability (also called the law of averages) in which the poor performance of a slow circuit element in a chain of circuit elements is compensated by faster elements in the chain. The variation of performance parameters of transistors during semiconductor manufacturing is unavoidable. The longer the chain of circuit elements, the better the averaging. In Direct bitline sensing method, the circuits that launch the address to the memory address inputs, the path from address inputs to the wordline, the memory cell read buffer, the bitline(s), the output buffers, and the circuits on the output of the memory that receive the memory data till the destination is reached where the data is captured using an on-chip clock, are all part of the long chain. Given that the memory cell is the slowest component due to its small size, and given that there are large quantity of memory cells, there is a high probability that there may be a very slow memory cell in the access chain described above. Therefore, having a long chain as above is advantageous and may lead to compensation of the slow performing memory cell by the other elements of the chain.

However, in the sense amplifier based design, the bit and bitbar lines are inputs to the sense amplifier; the sense amplifier needs to perform correctly to give the correct output. For the sense amplifier to perform correctly, one has to wait till sufficient differential is built at its inputs by considering the slowest memory cell possible. Only then should the sense amplifier be turned on. Until then, there is no activity on the output of the sense amplifier. Also, the sense amplifier isolates the memory cell from the chain. The slow performance of the memory cell may not be compensated by the circuit elements after the sense amplifier output. Hence the scope of Central Limit theorem is lesser here, leading to relative poorer performance compared to direct bitline sensing method.

In the various embodiments described herein, the sense amplifier is only enhancing the performance of the direct bitline sensing method, and is not a primary component for logic functionality of the memory as a whole. It does not isolate the bitline RBLB 230 from the output path BC312, but enhances the performance simultaneous with the activity on BC312.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of selective use of n-MOS and p-MOS devices, the methods and circuits described herein may be applied to other types of semiconductor devices. As another example, while certain aspects of the present disclosure have been described in the context of reading stored data at a particular storage node of the 8T memory cell, the methods and circuits described herein may be applied to read data stored at both the storage nodes of the 8T memory cell.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A differential sense circuit for reading an 8 transistor (8T) memory cell, the differential sense circuit comprising:
a differential input circuit having a pair of differential inputs and an output, wherein an output signal provided at the output is indicative of a difference between two signals received at the pair of differential inputs, wherein the difference is in accordance with a logic state read from the 8T memory cell; and
a sense amplifier coupled to the output, wherein the sense amplifier is operable to amplify a change in the output signal, the change being greater than a threshold, wherein the sense amplifier switches the output signal to have a voltage level corresponding to the logic state,
wherein a first one of the pair of differential inputs is coupled to a soft ground level reference node of a read buffer of the 8T memory cell and a second one of the pair of differential inputs is coupled to a read bit line of the read buffer.

2. The differential sense circuit of claim 1, wherein a voltage level at the soft ground level reference node is controllable by a switch disposed between the soft ground level reference node and a ground level bias supply voltage provided to the 8T memory cell.

3. The differential sense circuit of claim 1, wherein the change in the output signal being less than the threshold is indicative of a low logic state read from the 8T memory cell, and the difference being greater than the threshold is indicative of a high logic state read from the 8T memory cell.

4. The differential sense circuit of claim 1, wherein the sense amplifier is shared between a plurality of columns of an array formed by multiple ones of the 8T memory cell.

5. The differential sense circuit of claim 1, wherein the differential input circuit includes:
a pull-up circuit shared between a plurality of columns of an array formed by multiple ones of the 8T memory cell, wherein the pull-up circuit is operable to couple the output to a logic high level during an initialization phase; and
a pull-down circuit coupled to receive the pair of differential inputs and provide the output signal at the output, wherein the pull-down circuit includes:
a column select switch coupled to the output, wherein the column select switch corresponds to each one of the plurality of columns;
a first input switch coupled to the column select switch, the first input switch having a first gate coupled to a first one of the pair of differential inputs, the first gate being coupled to a soft ground level reference node of a read buffer of the 8T memory cell;

a second input switch having a second gate coupled to a second one of the pair of differential inputs, the second gate being coupled to a read bit line of the 8T memory cell;

a gate switch having a gate coupled to the second input switch, the gate switch being operable to couple the second input switch and the column select switch;

an initialization circuit having a first initialization switch and a second initialization switch, wherein the first initialization switch is operable to equalize voltages at the soft ground level reference node, the gate of the gate switch, and a ground level bias supply provided to the 8T memory cell during the initialization phase.

6. The differential sense circuit of claim 5, wherein the read bit line is precharged to the logic high level during the initialization phase.

7. The differential sense circuit of claim 1, wherein the sense amplifier includes:
a pair of cross-coupled inverters forming two nodes, wherein a first one of the two nodes is coupled to the output, wherein the pair of cross-coupled inverters are operable to amplify the output signal to one of a high logic state and a low logic state in accordance with the difference, the difference being greater than the threshold; and
a sense enable switch operable to enable the pair of cross-coupled inverters to amplify the output signal in accordance with the difference.

8. The differential sense circuit of claim 7, wherein the pair of cross-coupled inverters includes a deliberate offset circuit to force a second one of the two nodes to have a voltage offset relative to the first one, wherein the voltage offset causes the pair of cross-coupled inverters to store the logic state read from the 8T memory cell in accordance with the difference, the difference being less than the threshold.

9. The differential sense circuit of claim 7, wherein the two nodes are precharged to a logic high level before the sense enable switch is enabled.

10. The differential sense circuit of claim 1 further comprising:
an offset assist circuit coupled to the differential input circuit, wherein the offset assist circuit is operable to accelerate the change in a voltage level of the output signal in response to the change being greater than the threshold.

11. The differential sense circuit of claim 1, wherein the difference between the two signals measured over a configurable time period is greater than a corresponding change in any one of the two signals measured over the configurable time period.

12. The differential sense circuit of claim 11, wherein a faster change in the difference provides an improvement in a response time to read the logic state of the 8T memory cell compared to a traditional 8T memory cell.

13. A method for reading a logic state stored in an 8 transistor (8T) memory cell, the method comprising:

coupling a soft ground level reference node of a read buffer of the 8T memory cell to one of two differential inputs of a differential sense amplifier, wherein a second one of the two differential inputs is coupled to a read bit line of the read buffer; and detecting a differential voltage across the two differential inputs to read the logic state, wherein a change in the differential voltage is indicative of the logic state.

14. The method of claim 13, wherein the read buffer includes a source of a first read switch coupled in series to a drain of a second read switch, wherein a gate of the first read switch is controlled by a storage node of the 8T memory cell, wherein the logic state is stored in the storage node, wherein a gate of the second read switch is controlled by a write line, wherein a source of the second read switch is coupled to the ground level reference node, wherein a drain of the first read switch is coupled to the read bit line.

15. The method of claim 13 further comprising:
precharging the read bit line;
equalizing voltages of the soft ground level reference node and a ground level bias supply provided to the 8T memory cell prior to the detecting; and
asserting the read bit line and a word line of the 8T memory cell to enable the reading.

16. The method of claim 13, wherein the change in the differential voltage is faster compared to a change for any one of the two differential inputs.

17. The method of claim 16, wherein the faster change in the differential voltage provides an improvement in a response time to read the logic state.

18. A memory device comprising:
an array formed by a plurality of rows and a plurality of columns of an 8 transistor (8T) memory cell;
a differential input circuit having a pair of differential inputs and an output, wherein an output signal provided at the output is a difference between two signals received at the pair of differential inputs, wherein the difference is indicative of a logic state read from the 8T memory cell, wherein the differential input circuit includes:
a pull-up circuit shared between selected ones of the plurality of columns of the array, wherein the pull-up circuit is operable to couple the output to a logic high level during an initialization phase;
a pull-down circuit corresponding to each of the selected ones of the plurality of columns, wherein the pull-down circuit is coupled to receive the pair of differential inputs and provide the output signal at the output; and
a sense amplifier coupled to the output, wherein the sense amplifier is shared between the selected ones of the plurality of columns of the array, wherein the sense amplifier is operable to amplify the output signal to the logic state in response to the difference being greater than a threshold.

19. The memory device of claim 18, wherein the selected ones of the plurality of columns is at most equal to 4.

* * * * *